United States Patent
Houkes et al.

(10) Patent No.: US 7,005,823 B2
(45) Date of Patent: Feb. 28, 2006

(54) POSITIONING SYSTEM AND POSITIONING METHOD

(75) Inventors: Martijn Houkes, Sittard (NL); Henrikus Herman Marie Cox, Eindhoven (NL); Ramidin Izair Kamidin, Tilburg (NL); Patricia Vreugdewater, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/969,235

(22) Filed: Oct. 21, 2004

(65) Prior Publication Data

US 2005/0140326 A1  Jun. 30, 2005

(30) Foreign Application Priority Data

Oct. 21, 2003  (EP) ................... 03078310

(51) Int. Cl.
*G05D 23/275*  (2006.01)

(52) U.S. Cl. .............. 318/632; 318/560; 318/567; 318/568.22

(58) Field of Classification Search .......... 318/632, 318/560, 567, 568.22, 609, 610; 355/72, 355/53; 360/77.03; 369/275.4
See application file for complete search history.

(56) References Cited

U.S. PATENT DOCUMENTS

| | | | |
|---|---|---|---|
| 4,485,339 A | 11/1984 | Trost | |
| 4,506,205 A | 3/1985 | Trost et al. | |
| 4,507,597 A | 3/1985 | Trost | |
| 4,535,278 A | 8/1985 | Asakawa | |
| 5,528,118 A | 6/1996 | Lee | |
| 6,363,809 B1 | 4/2002 | Novak et al. | |
| 6,472,777 B1 | 10/2002 | Teng et al. | |
| 6,646,721 B1 * | 11/2003 | Compter et al. | ............... 355/72 |
| 6,657,809 B1 * | 12/2003 | Ottesen et al. | ........... 360/77.03 |

FOREIGN PATENT DOCUMENTS

| | | |
|---|---|---|
| EP | 0 502 578 A1 | 9/1992 |
| EP | 1 341 044 A2 | 9/2003 |
| EP | 1 341 044 A3 | 10/2003 |

* cited by examiner

*Primary Examiner*—Karen Masih
(74) *Attorney, Agent, or Firm*—Pillsbury Winthrop Shaw Pittman LLP

(57) ABSTRACT

A positioning system for moving an object to a target position is presented. In an embodiment, the system includes a first actuator configured to exert a force on the object in a first direction in response to a control current, the actuator having an actuator gain and the generated force being a function of the control current and the actuator gain, the actuator including a magnet configured to induce a magnetic field; and a coil arranged in the magnetic field, the magnet and the coil being movable relative to each other. The system also includes a power supply configured to supply the control current to the actuator in response to a control signal; and a control system configured to control the force generated by the actuator by supplying the control signal to the power supply, the control signal being adapted to the actuator gain, the gain being predetermined as a function of a parameter.

16 Claims, 5 Drawing Sheets

POSITIONING SYSTEM AND POSITIONING METHOD

PRIORITY INFORMATION

This application claims priority from European Patent Application No. 03078310.4, filed Oct. 21, 2003, the content of which is herein incorporated by reference in its entirety.

BACKGROUND

1. Field of the Invention

The present invention relates to lithographic apparatus and methods.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed.

Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or antiparallel to this direction.

Before exposing radiation to the substrate through the patterning device, the substrate and the patterning device should be aligned by positioning the substrate, the patterning device or both. Also, other parts of a lithographic apparatus may be moveable and may need to be positioned at any time during a process of applying a pattern onto the substrate. Positioning should be done accurately and may require an accurate positioning system.

Positioning may be performed using a driving device, e.g. a motor, to which the object may be attached, or otherwise connected. An example of a driving device is a Lorentz actuator, i.e. an actuator including at least one magnet for inducing a magnetic field, and at least one coil, positionable and moveable in the magnetic field. Due to physical laws, when a current runs through the coil, a force is generated which is directed orthogonal to both the current and the magnetic field. Due to this force, the coil and the magnet may move relative to each other. Thus, a control current supplied to the actuator controls the force exerted on the object, and thus its movement, the object being connected to either the coil or the magnet.

The magnet may be any kind of magnet, e.g. an electromagnet or a permanent or natural magnet. The coil may include a number of windings of conductive wire, for example. To generate a force, a current should run through the coil and a magnetic field should be present. To vary the strength of the force, the current may be varied or the intensity of the magnetic field may be varied, for example by varying the current running through an electromagnet.

Usually, a position control system employing position feedback is included in a control system connected to the driving device, e.g. a Lorentz actuator, to improve the accuracy of the positioning. Due to characteristics of the actuator, the actual position of the object after movement may deviate from the target position. Therefore, the actual position of the object may be measured during and after movement and may be fed back to the positioning system. A difference between the target position and the actual position may then be compensated by repositioning the object.

However, before the object arrives at the target position, such a position control system may have needed time to compensate a number of erroneous movements and repositioning the object a number of times. While the object may arrive at the target position with the required accuracy, the time needed to arrive at the target position, i.e. the settling time, may be relatively long. In case of a lithographic apparatus, a long settling time reduces the throughput of the apparatus.

SUMMARY

Embodiments of the present invention include a positioning system configured to move an object to a target position without settling time, or at least with a reduced settling time compared to a position control system employing position feedback.

According to an embodiment of the present invention, there is provided a positioning system for moving an object to a target position, the system including a first actuator configured to exert a force on the object in a first direction in response to a control current, the actuator having an actuator gain and the generated force being a function of the control current and the actuator gain, the actuator including a magnet for inducing a magnetic field; and a coil in the magnetic field, the magnet and the coil being movable relative to each other; a power supply configured to supply the control current to the actuator in response to a control signal; and a control system configured to control the force generated by the actuator by supplying the control signal to the power supply, the control signal being adapted to the actuator gain, which gain is a function of at least one parameter.

A positioning system for moving an object to a target position, in accordance with an embodiment of the invention includes (a) a first actuator configured to exert a force on the object in a first direction in response to a control current, the actuator having an actuator gain and the generated force being a function of the control current and the actuator gain, the first actuator including (i) a magnet configured to induce a magnetic field; and (ii) a coil arranged in the magnetic field, the magnet and the coil being movable relative to each other; (b) a power supply configured to supply the control current to the actuator in response to a control signal; and (c) a control system configured to control the force generated by the actuator by supplying the control signal to the power supply, the control signal being adapted to the actuator gain, the gain being a function of a system parameter.

The force generated by the actuator and exerted on the object is a function of the control current supplied to the actuator and an actuator gain. The actuator gain thus indicates the force generated in response to a current. However, the actuator gain may also represent any non-ideal characteristics of the actuator. Characteristics that may be represented by the actuator gain include the homogeneity of the magnetic field, a non-linear response to an amount of control current, or generation of parasitic forces, i.e. forces in other directions than desired.

In practice, the actuator gain has been assumed to be constant and therefore, it has been assumed that a certain current supplied to the actuator always results in the same desired force and in the same undesired forces (i.e. parasitic forces) leading to deviations from the target position. These deviations have been compensated using a position control system employing position feedback. However, as mentioned above, the actuator gain may represent different characteristics of the actuator. Thereto, the actuator gain may be a function of at least one system parameter.

The actuator generates the force in response to the control current that is supplied by a current or voltage power amplifier supply. The power supply supplies the control current in response to a control signal that is supplied by a control system. The control system determines the required displacement of the object from its original position to the target position. The control system supplies a control signal to the power supply to control the force exerted on the object, which force makes the object accelerate and move towards the target position.

The control system may control the exerted force by controlling the power supply and thus the control current. The control signal, and thus the control current, may then be adapted to the actuator gain. The control system may be provided with the actuator gain and calculates the generated force in response to the control signal. Based on the actuator gain, the control system may calculate the actual displacement of the object in response to the control signal. Apart from the actuator gain dependency on at least one system parameter, the control system may be a control system as known in the art, possibly as disclosed in pending non-published European patent application 03077992.0.

The actuator gain may be a function of at least one system parameter. The system parameter may be any parameter influencing the actuator gain. During positioning of the object, the actual value of the system parameter may be determined at any time, possibly continuously, for example by measuring or calculating. The value of the parameter may also be predetermined in advance. The value of the parameter then determines the actual actuator gain at that moment. Using the actual actuator gain may then be used to compensate the control current such that a desired force is generated. The desired force may be a force determined by the control system that moves the object to the target position if exerted for a certain period of time.

A positioning system according to an embodiment of the present invention may prevent that deviations of the object position from the target position occur. Using the actuator gain as a function of at least one system parameter, the force exerted on the object may be known at any time. With the known force, the displacement may be accurately calculated and corrected if the displacement deviates from the desired displacement. If only small deviations arise during movement, only small deviations need to be compensated by a position control system using feedback of the actual position of the object. Small deviations will thus only take a short, i.e. reduced, settling time to be compensated. If no deviations arise at all, no settling time is required.

In an embodiment of the present invention, the control system may determine a time-variant force that may be exerted on the object to move the object to the target position and output at least one time-variant control signal to the power supply to generate the force. A displacement from the actual position to the target position may be achieved by an innumerable number of time-variant forces. Based on actuator characteristics and other possibly limiting conditions, the control system may determine or select a force as a function of time that will move the object to the target position. The control system then calculates a control current as a function of time corresponding to the time-variant force using the actuator gain to generate the force.

The actuator gain may represent a number of characteristics of the actuator. Such characteristics may be a dependency of the force on a distance between the coil and the magnet. Therefore, the actuator gain may be a function of the distance between the coil and the magnet. The control system may then adapt the control signal to the distance between the magnet and the coil.

The actuator force is generated by a current running through the coil, which is positioned in the magnetic field. Therefore, the force depends on the magnetic field and the current. Any deviation from homogeneity of the magnetic field will result in a variation in actuator gain.

The magnetic field may vary in intensity with the distance of the coil to the magnet. In particular, it has been found that the intensity may vary with a second-order function of the distance. Thus, the actuator gain may vary as a second-order function of the distance between the coil and the magnet. Therefore, advantageously, the actuator gain may be a function of the distance between the coil and the magnet.

The distance between the coil and the magnet may deliberately be changed, but may also change due to characteristics of the system. Therefore, the distance between the coil and the surface of the magnet may be measured continuously or in samples at predefined intervals and then supplied to the control system. With the measured distance, the control system according to an embodiment of the present invention may adapt the control signal and control current to the actuator gain as a function of the distance.

Further, the actuator gain may advantageously be a function of the control current supplied to the actuator and the control system adapts the control signal to the control current. It has been found that the actuator gain is a function of both the amplitude of the current and the direction of the current. Thus, the amount and the direction of the current influence the force generated by the actuator.

Further, the actuator gain may be a function of the relative position of the coil and the magnet in a plane substantially perpendicular to the direction of the magnetic field. The magnetic field may exhibit deviations from homogeneity in other directions than perpendicular to a surface of the magnet, i.e. the distance to the magnet. Assuming that the direction of the magnetic field is substantially perpendicular to a surface of the magnet, the actuator gain may vary in a plane substantially perpendicular to the direction of the magnetic field, that is, in a plane substantially parallel to a surface of the magnet.

Due to characteristics of the actuator, a control current may generate not only a force in a direction in which a movement is desired, perpendicular to the current through the coil and to the direction of the magnetic field, but also forces in other directions may be generated. The control system may compensate such parasitic forces. Thereto, the control system may include a second actuator, which may exert a compensation force on a part of the first actuator, to compensate a parasitic force exerted on the part of the first actuator. For example, if a parasitic force acts on the coil, the coil may tend to move towards the magnet, resulting in a change of the actuator gain. A second actuator however, may exert a force on the coil, which force is the same as, but oppositely directed to the parasitic force. Thus, the parasitic force is compensated and the second actuator prevents the coil from moving in an undesired direction.

Note that, as the parasitic forces are generated due to the control current, it may not be possible or it may be difficult to compensate them, or prevent them from being generated, by controlling the control current. Therefore, the control system may compensate the parasitic forces with opposing forces. Further, such compensation of parasitic forces using other actuators exerting forces on a part of the first actuator may also be used in well-known positioning systems without a control system that controls the generated force according to the present invention.

The actuator gain may be determined also in other directions than the desired positioning direction. Advantageously, the actuator gain may be determined in a parasitic direction, and the control system supplies a control signal to the second actuator to compensate a parasitic force generated in the parasitic direction. Based on the actuator gain determined in at least one parasitic direction, the control system may calculate the parasitic forces that may occur during movement. Thus, the control system may control the second actuator to prevent an undesired displacement.

According to a further embodiment of the invention, there is provided a lithographic apparatus including an illumination system configured to provide a beam of radiation; a support structure or pattern support configured to support a patterning device, the patterning device serving to impart the beam of radiation with a pattern in its cross-section; a substrate table or substrate support configured to hold a substrate; and a projection system configured to project the patterned beam onto a target portion of the substrate, wherein the lithographic apparatus further includes at least one positioning system according to at least one embodiment of the invention, in particular for controlling a movement of the support structure or pattern support, the substrate table or substrate support, or both.

According to another embodiment of the present invention, there is provided a positioning method for moving an object to a target position, the method including determining an actuator gain of an actuator as a function of at least one system parameter, the actuator being adapted for exerting a force on the object in a first direction in response to a control current supplied by a power supply, which force is a function of the control current and the actuator gain; determining a value of the at least one system parameter as a function of which the actuator gain is predetermined; controlling the force generated by the actuator by supplying a control signal to a power supply, the control signal being adapted to the predetermined actuator gain as a function of the at least one system parameter, the value of which is determined in the previous step; and supplying the control current from the power supply to the actuator in response to the control signal.

According to a further embodiment of the invention, there is provided a device manufacturing method including providing a substrate; providing a projection beam of radiation using an illumination system; using a patterning device to impart the projection beam with a pattern in its cross-section; and projecting the patterned beam of radiation onto a target portion of the substrate, and controlling a movement according to the positioning method according to at least one embodiment of the present invention, in particular controlling a movement of the patterning device, the substrate, or both.

A device manufacturing method, in accordance with an embodiment of the invention includes (a) projecting a patterned beam of radiation onto a target portion of a substrate, and (b) positioning an object to a target position, the positioning including (i) determining an actuator gain of an actuator as a function of a parameter, the actuator being adapted to exert a force on the object in a first direction in response to a control current supplied by a power supply, the force being a function of the control current and the actuator gain; (ii) controlling the force generated by the actuator by supplying a control signal to a power supply, the control signal being adapted to the actuator gain, and (iii) supplying the control current from the power supply to the actuator in response to the control signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
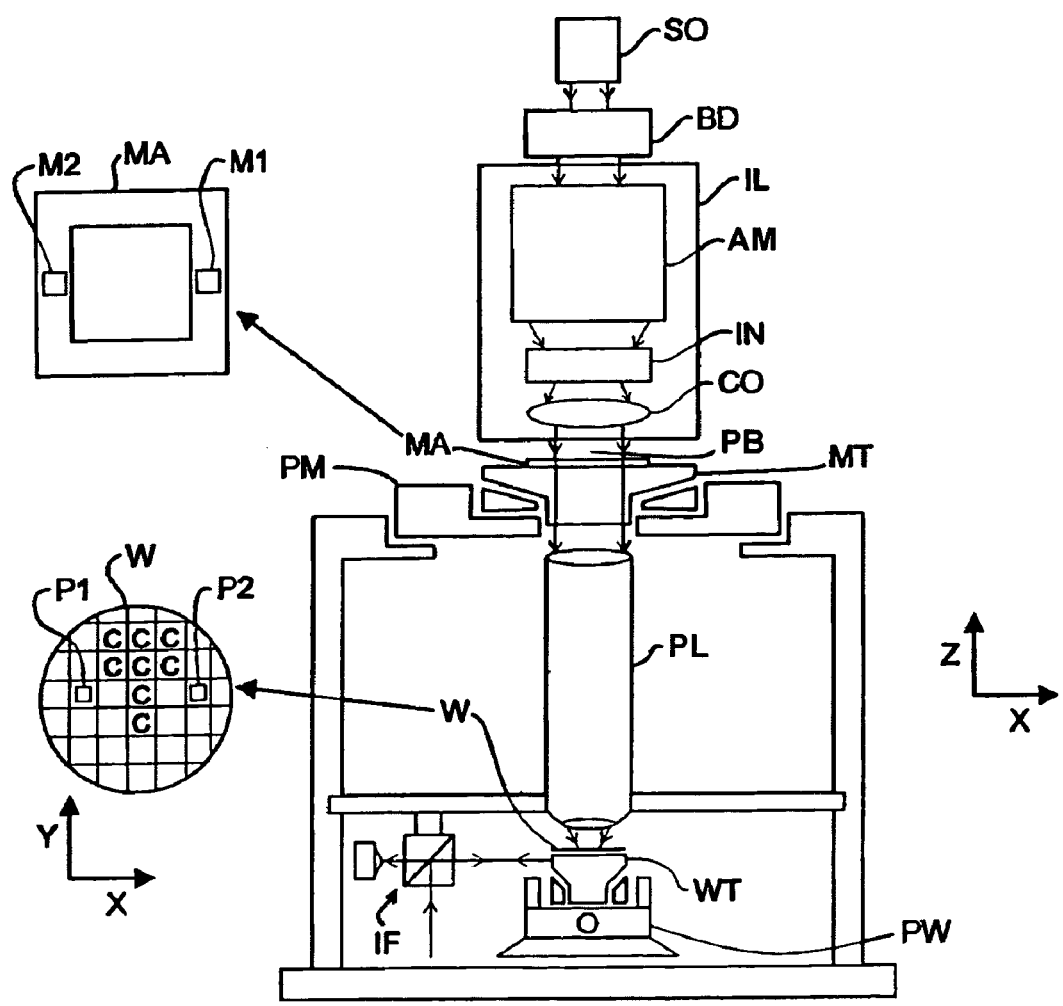
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation) and a first support structure (e.g. a mask table) MT configured to support a patterning device (e.g. a mask) MA and connected to a first positioning device PM configured to accurately position the patterning device with respect to the projection system ("lens"), item PL. The apparatus also includes a substrate table (e.g. a wafer table) WT configured to hold a substrate (e.g. a resist-coated wafer) W and connected to a second positioning device PW configured to accurately position the substrate with respect to the projection system ("lens"), item PL, the projection system (e.g. a refractive projection lens) PL being configured to image a pattern imparted to the beam of radiation PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The beam of radiation PB is incident on the mask MA, which is held on the mask table MT. Having traversed the mask MA, the beam of radiation PB passes through the projection system ("lens") PL, which focuses the beam onto a target portion C of the substrate W. With the aid of the second positioning device PW and position sensor IF (e.g. an interferometric device), the substrate table or substrate support WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

Step mode: the mask table or pattern support MT and the substrate table or substrate support WT are kept essentially stationary, while an entire pattern imparted to the beam of radiation is projected onto a target portion C at once (i.e. a single static exposure). The substrate table or substrate support WT is then shifted in the X and/or Y direction so that a different target portion C can be exposed. In step mode, the maximum size of the exposure field limits the size of the target portion C imaged in a single static exposure.

Scan mode: the mask table or pattern support MT and the substrate table or substrate support WT are scanned synchronously while a pattern imparted to the beam of radiation is projected onto a target portion C (i.e. a single dynamic exposure). The velocity and direction of the substrate table or substrate support WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table or pattern support MT is kept essentially stationary holding a programmable patterning device, and the substrate table or substrate support WT is moved or scanned while a pattern imparted to the beam of radiation is projected onto a target portion C. In this mode, generally a pulsed radiation source is employed and the programmable patterning device is updated as required after each movement of the substrate table or substrate support WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
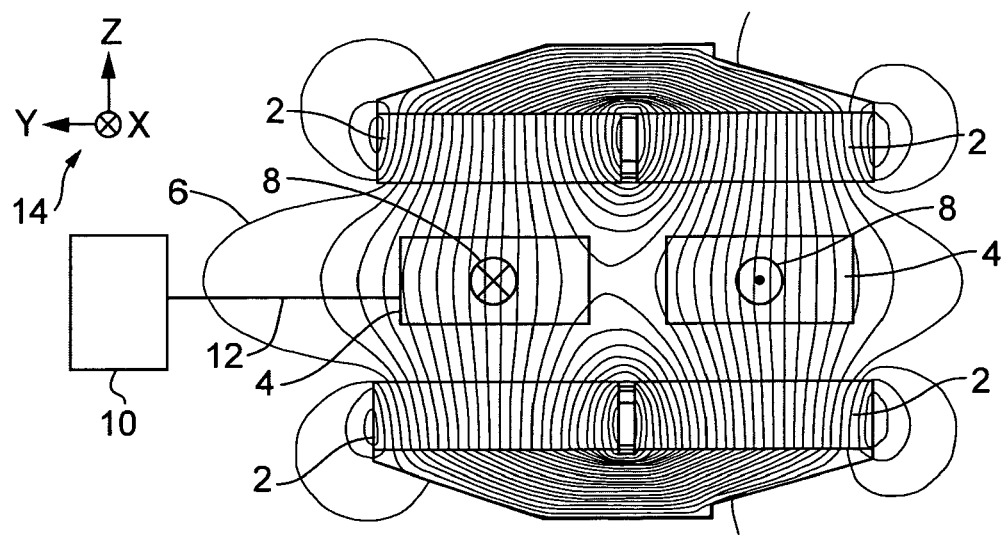
FIG. 2 schematically shows the magnetic field distribution of a linear (Lorentz) actuator.

FIG. 2 illustrates a sectional view of a Lorentz actuator including magnets 2 and a coil 4. FIG. 2 also illustrates the magnetic field distribution indicated by magnetic field lines 6 and induced by magnets 2 and a current 8 (indicated symbolically by its directions of flow) carried by coil section 4. A control system 10 including a power supply supplies the current 8 to the coil 4 via one or more wires 12. A coordinate system 14 indicates a x, y, and z-direction to which may be referred hereinafter.

The magnets 2 shown in FIG. 2 may be four separate magnets 2. However, the four shown magnets 2 may be parts of one or more large magnets. The magnets 2 may be permanent magnets, electromagnets or any other type of magnets. On one side of the actuator, the magnetic field 6 runs in the positive z-direction and on the other side, the magnetic field runs in the negative z-direction.

The coil 4 is shown as one coil 4 having two parts in the sectional plane. In the left-hand part, the current 8 runs into the sectional plane (positive x-direction) and in the right-hand part the current 8 comes out of the sectional plane.

Due to physical laws (Maxwell's law), when a current runs perpendicularly through a magnetic field, a force is generated orthogonal to both the current and the magnetic field. Now referring to FIG. 2, the magnetic field 6 is substantially orientated in the z-direction and the current 8 is orientated in the x-direction, thus a force is generated that is substantially orientated in the y-direction. The force acts upon both the magnets 2 and the coil 4, i.e. the magnets 2 and the coil 4 will accelerate relative to each other in the y-direction. Because of the differences in directions of the magnetic field 6 and the current 8 on both sides of the Lorentz actuator shown in FIG. 2, the force on both sides of the magnets 2 and the coil 4 is orientated in one direction (positive or negative y-direction).

The strength of the force depends on the intensity of the magnetic field 6 and the amount of current 8, among others. Assuming that the actuator in FIG. 2 is only controlled by the control system 10 and thus only by a current 8 through the coil 4, the strength of the force is equal to the amount of current 8 times a gain G. Ideally, the gain G may be independent of time and independent of the relative position of coil and magnet over the operating range of the actuator. In practice, however, the actuator gain G may be affected by a number of non-ideal characteristics of the actuator.

Figure 3A:
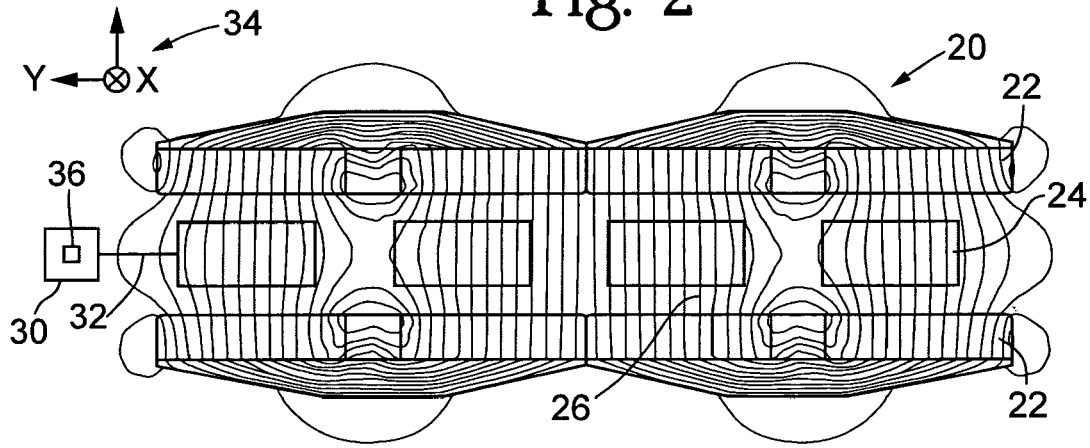
FIG. 3A schematically illustrates the magnetic field distribution of an actuator, wherein no current runs through the coils.

FIG. 3A illustrates the magnetic field distribution of another Lorentz actuator The magnetic field distribution shown in FIG. 3A was calculated using Finite Elements Method Software with no current running through the coils of the actuator. The actuator 20 includes magnets 22, coils 24, a control system 30 including a power supply, and one or more power supply wires 32. Also, like in FIG. 2, a coordinate system 34 is indicated. Magnetic field lines 26 indicate a magnetic field between the magnets 22. No current runs through the coils 24. The assembly shown in FIG. 3A includes the assembly shown in FIG. 2 twice, but functions substantially the same.

It is assumed in the description hereinafter that the magnets 22 are substantially stationary and the coils 24 may move relative to the magnets 22 due to a force generated by the magnetic field 26 and a current through the coils 24. However, it should be noted that the coils may be substantially stationary and the magnets may move, or both magnets and coils may move as a result of the generated force.

The magnetic field is not ideal: the magnetic field is not homogeneous as can be seen from variations in distance between the magnetic field lines 26. In particular near the edges of the magnets 22, the magnetic field 26 may exhibit significant variations in intensity. Because of these intensity variations, a gain G of the actuator is not constant with respect to the position of the coils 24 relative to the magnets 22. Thus, the movement of the coils 24 relative to the magnets 22 is at least dependent from the current through the coils 24 and the position of the coils 24. Note that the magnetic field and thus the gain G varies in the z-direction as well as in the y-direction. Possibly, there may also be a x-direction variation, but such a variation is omitted in this description as FIG. 3A only shows a sectional plane orthogonal to the x-direction.

When the actuator gain G is assumed to be constant, the position dependency of the force and thus of the movement results in a positional error after the movement with respect to the target position. The error may be corrected by a feedback of the actual position and repositioning the coils 24. This may result in another positional error and thus another correction, and so on, until the target position is reached. Such a correction method, however, may take time.

According to an embodiment of the present invention, a compensation circuit 36 is included in the control circuit 30 to account for dependencies of the actuator gain G on a number of parameters. For example, in practice, measurements have shown that the intensity variations in the z-direction may be approximated by a second-order function with respect to the distance between the coils 24 and the magnets 22. The inverse of the second-order function may be implemented in the compensation circuit 36. Then, when the control circuit 30 supplies a current to the coils 24, the compensation circuit 36 may compensate the current for the variations in the magnetic field 26 before a positional error due to the variations may occur. Similarly, there may be a compensation circuit present for compensating variations in the y-direction.

Figure 3B:
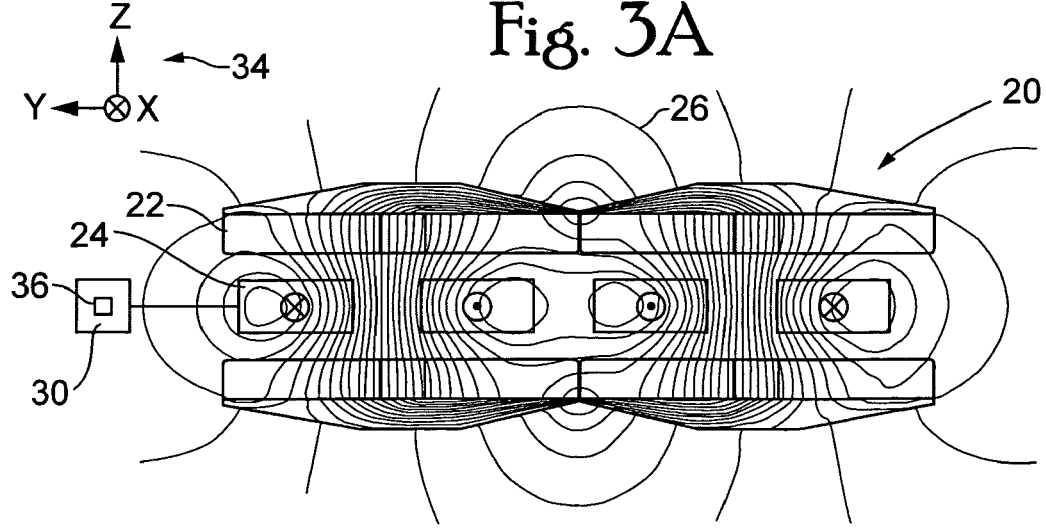
FIG. 3B schematically illustrates the magnetic field distribution of an actuator, wherein a current runs through the coils.

FIG. 3B shows an assembly like the one shown in FIG. 3A. In FIG. 3B, however, a current runs through the coils 24, whereas there was no current in FIG. 3A. The current through the coils 24 generates a force accelerating the coils, still assuming that the magnets 22 are substantially stationary. Since the magnetic field generated by the current through the coils 24 affects the total magnetic field distribution, it may be concluded that the actuator gain G will be dependent from the momentary current through the coils 24. With the compensation circuit 36 in control system 30, this dependency may be compensated. Further, the above-described current dependency may also include a dependency on the direction of the current.

Figure 3C:
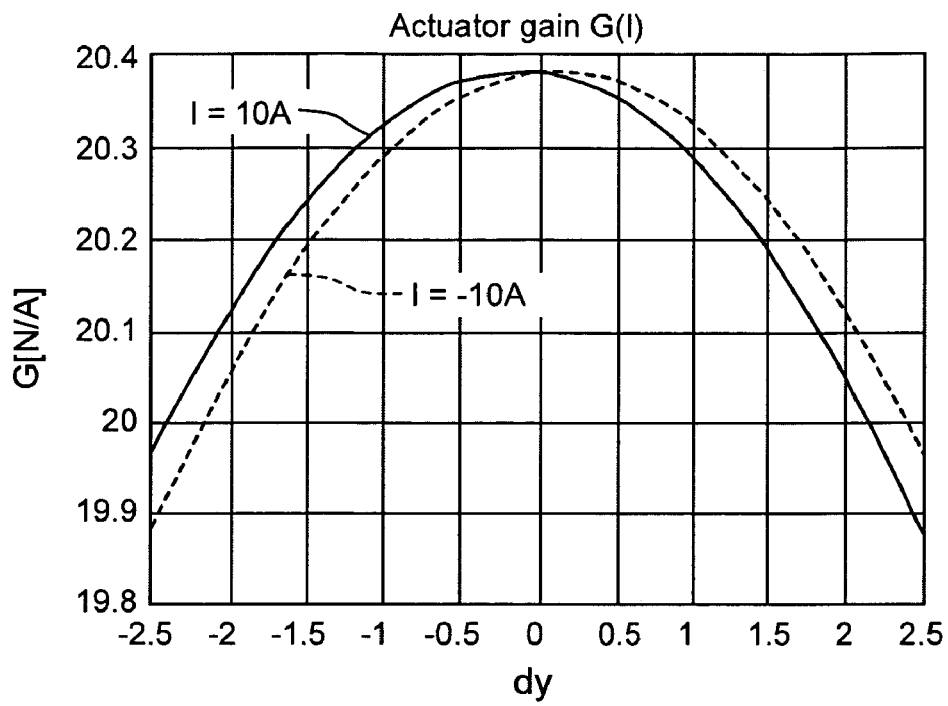
FIG. 3C shows a diagram with two graphs illustrating the value of the actuator gain as a function of the position for two different currents through the coil.

FIG. 3C depicts a diagram wherein the actuator gain G is depicted as a function of its position (dy) in a plane substantially perpendicular to the direction of the magnetic field (y-direction in FIGS. 3A and 3B). The position dependency is determined and depicted for two cases: a first wherein a positive current of 10A (I=10A) runs through the coil, and a second wherein a negative current of 10A (I=−10A) runs through the coil. The directions of the currents are opposite and thus opposing forces are generated. The position in z-direction is kept constant and the same for both cases.

The diagram shown in FIG. 3C illustrates that the actuator gain G varies as a function of the y-position of the coil relative to the magnet. Further, the diagram illustrates that the actuator gain G is a function of the direction of the current. Both gain variations can be approximated as a second-order function of the position dy representing the relative displacement in y-direction between coils and magnet assembly. The position dy=0 represents the symmetrical position of the coils relative to the magnet assembly. It should be noted that the characteristic for I=−10A can be obtained by mirroring the characteristic for I=10A around the vertical axis of FIG. 3C originating in dy=0.

Figure 4:
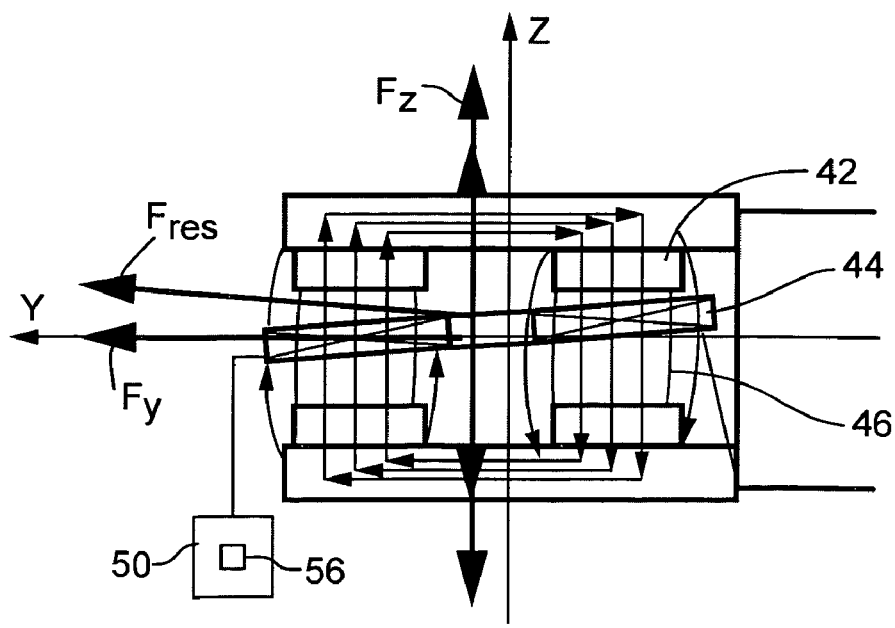
FIG. 4 schematically illustrates an actuator wherein parasitic, orthogonal forces are exerted on the coil.

Whereas FIG. 3C illustrates variations in strength of the generated force, FIG. 4 illustrates a deflection of the generated force. Again, a Lorentz actuator is schematically shown having magnets 42, a coil 44, a magnetic field 46, a control system 50 including a power supply, and a compensation circuit 56 provided with the actuator gain as a function of at least one system parameter according to an embodiment of the present invention.

Due to certain properties of the combination of the magnets 42 and the coil 44, when a current runs through windings of the coil 44, not only a force in the orthogonal direction (Fy) is generated, but also in the x-, and z-direction forces (Fx, Fz) may be generated. These forces are not desired and will be referred to hereinafter as parasitic forces. For example, these parasitic forces may force the coil 44 to shift towards a magnet 42 or rotate the coil 44 as shown in FIG. 4. First of all, such a shift or rotation is undesirable, but secondly such a shift or rotation may result in further actuator gain variations due to the magnetic field variations as described above.

The parasitic forces may be compensated by the compensation circuit 56 included in the control system 50. The parasitic forces may be calculated according to equations wherein the relevant characteristics of the coil 44, the magnetic field 46 and the combination thereof are included or they may be determined from an actuator gain. Using the equations or the actuator gain, the compensation circuit 56 may calculate the forces in advance. With the aid of a feed-forward circuit, the compensation circuit 56 may apply a force opposite to the parasitic forces such that no shift or rotation results.

Figure 5:
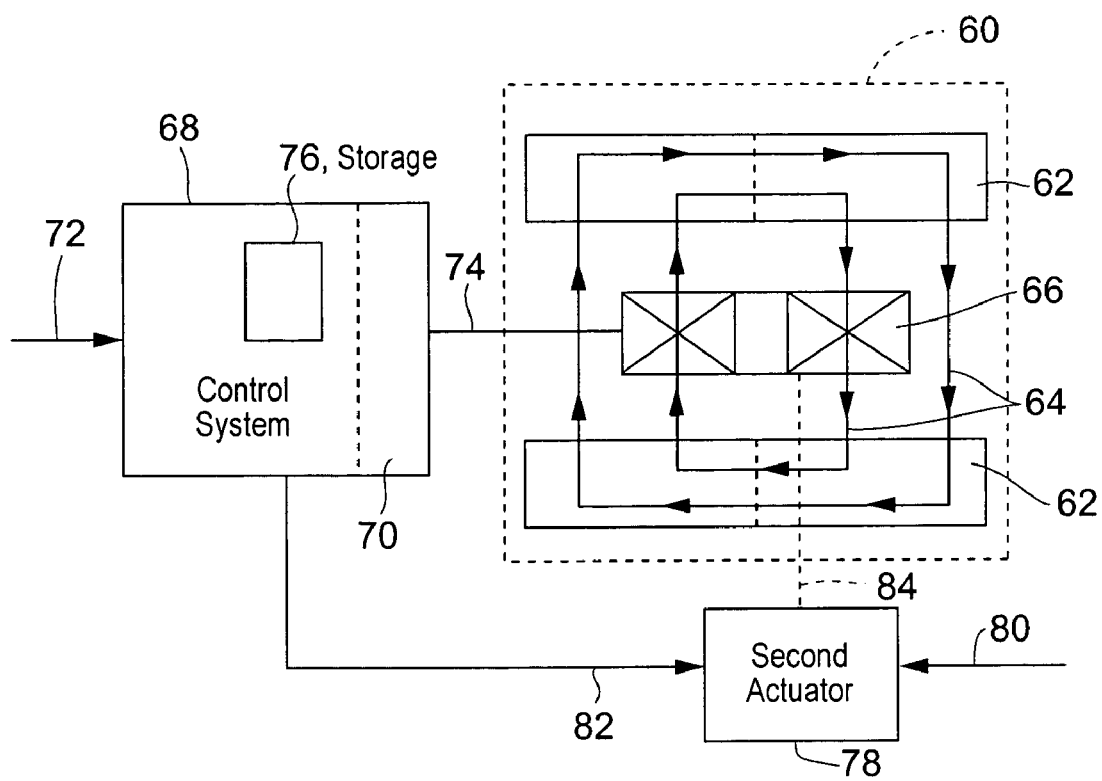
FIG. 5 schematically illustrates an actuator and a control system according to an embodiment of the present invention.

FIG. 5 illustrates an actuator assembly according to an embodiment of the present invention. An actuator 60, including magnet assemblies 62, and a coil 66 is connected to a control system 68. The magnetic field induced by the magnet assemblies 62 is schematically indicated by magnetic field lines 64. The control system 68 includes a power supply 70 and a target position input 72. The power supply 70 may supply a control current to the coil 66 of the actuator 60 via connection 74. The control system 68 further includes a storage 76, wherein the determined actuator gain G is stored. The storage 76 may be a digital storage device such as a RAM or ROM, but it may also be an electronic or digital filter having the characteristics of the actuator gain G as a function of a system parameter.

The embodiment of FIG. 5 further includes a second actuator 78. The second actuator 78 may position the coil 66 at a z-position via mechanical interface 84. The input z-position may be input using a separate control input 80 to displace an object connected or attached to the coil 66 to a desired z-position. In addition, the control system 68 may input a control signal via the z-input 82 or the separate control input 80 to generate a force in the z-direction to compensate any parasitic force in the z-direction.

The second actuator 78 may be of any type. It may be the same type of actuator as the first actuator 60. It may also be a pneumatic device or any other device adapted to exert a force on a part of the actuator 60.

In operation, a target position may be input into the control system 68 at input 72. The control system 68 may be adapted to calculate a displacement from the actual position of an object attached or connected to the coil 66 to the target position. Using the determined actuator gain G stored in storage 76, the control system 68 may calculate the control current needed to generate a force to move the coil 66 and thus the object to the target position. According to the calculated control current, the control system 68 may send a control signal to the power supply 70, which may be a part of the control system 68 or may be a separate device. The power supply feeds the control current in response to the control signal to the actuator 60, in this case to the coil 66 of the actuator 60.

In this embodiment of the invention, it is assumed that positioning is performed with such a high accuracy that no feedback of the actual position is needed. The position of the coil 66 or the object may be calculated from a once measured or otherwise determined and input position and then calculated from induced displacements. However, there may also be a position measurement device and a feedback of the measured position, such that the control system 68 may correct or compensate any deviations from the calculated position.

The position and possibly other parameters may be determined in the control system 68 or measured and input into the control system 68. The parameters are then used by the control system 68 to accurately determine the actually generated force in the actuator 60 from the actuator gain G as a function of the parameters and the control current.

Figure 6:
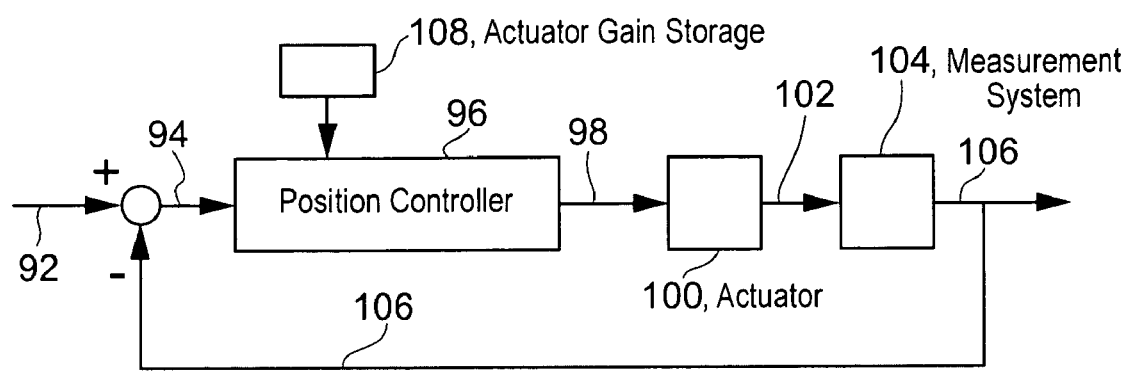
FIG. 6 schematically illustrating a control system according to an embodiment of the present invention.

FIG. 6 shows an exemplary embodiment of a control system that employs position feedback for controlling the position of an object attached or connected to an actuator. Externally from the control system, a desired absolute position is determined and fed to the control system via a set point input 92. From the desired absolute position, a measured actual absolute position 106 of the controlled object may be subtracted resulting in a desired relative movement signal 94 of the object. The desired relative movement signal 94 is then supplied to a position controller 96 via a position controller input thereof. The position controller 96 is a device well known to a person skilled in the art and capable of translating a movement signal into control signals. The position controller 96 may include a PID controller, a low-pass filter and an amplifier, for example.

A control signal output from the position controller 96 may be referenced as a position controller signal 98. The position controller signal 98 is input into an actuator 100, resulting in an acceleration 102 of the object attached or connected to it.

A measurement system 104 may determine the acceleration 102 and calculate the actual position 106 of the object or it may measure the actual position 106 directly, ignoring any acceleration 102. The actual position 106 is fed back to the input of the system and subtracted from the target position, input at set point input 92.

In FIG. 6, an actuator gain storage 108 is added to the control system. The actuator gain storage 108 is configured to store the actuator gain as a function of one or more parameters. The actuator gain storage is connected to the position controller 96 that calculates the control signal 98.

A person skilled in the art will readily understand how the position control system of FIG. 6 generally functions. A position input at set point 92 is subtracted with an actual measured position signal 106 by a subtractor resulting in a desired movement signal 94. Based upon the desired movement 94, the position controller 96 determines a force and duration of the force to move the object to the desired position. The control signal 98 output from the position controller 96 is supplied to the actuator 100. The object accelerates as a result of the force resulting from the actuator 100 controlled by the position controller 96.

The actual position 106 is measured and this position signal is fed back to the subtractor calculating the error 94 between the desired command position 92 and the actual position 106 The correction of the movement signal 94 results. The actual movement may however be different from the desired movement that was intended to result from the force applied by the actuator 100 because of a dependency of the actuator gain on one or more parameters. Thus, the position controller 96 needs to change the control signal to compensate for deviations from the target position.

The position controller 96 shown in FIG. 6, however, may receive the actual actuator gain from the storage 108 as a function of any relevant parameter. Based on the received actual actuator gain, the position controller 106 may output a more accurate control signal 98 and thus the object may approach or reach the target position with less or maybe even without any iterations of the position feedback loop.

Note that FIG. 6 does not include any feedforward circuits. However, in practice, feedforward circuits may be present. For example, the desired position 92 may correspond to a desired object acceleration. The desired object acceleration is generally processed, for example multiplied by the object mass, and added to the position control signal 98. Other feedforward circuits may be present as well, depending on details of object characteristics.

It should be understood that the embodiment described in relation to FIG. 6 is merely exemplary. The actuator gain may be embedded in the position controller 96 and not stored in a separate storage device. Also, other embodiments using feedforward signals to other actuators are possible.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables or substrate supports (and/or two or more mask tables). In such "multiple stage" machines the additional tables may be used in parallel, or preparatory steps may be carried out on one or more tables or supports while one or more other tables or supports are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

While specific embodiments of the invention have been described above, it will be appreciated that the invention may be practiced otherwise than as described. The description is not intended to limit the invention.

In addition, although the present invention has been described in combination with a Lorentz actuator including a coil and a magnet, the present invention may also be employed using any other kind of actuator. Thus, determining an actuator gain as a function of one or more parameters and using the determined actuator gain to accurately position an object may be performed with any other actuator. As an example, the present invention may also be applied in linear motors or planar motors that are equipped with multi-phase windings and are powered by a three-phase current supply or a separate current supply per phase. In the particular case of linear motors, the present invention may be applied to compensate for parasitic effects such as cogging or saturation. The present invention may also be applied to anticipate on a non-sinusoidal magnetic field distribution encountered by the linear motor or planar motor. By pre-determining the shape of the magnetic field, the appropriate current profile versus position can be determined in order to generate the required force profile.

What is claimed is:

1. A positioning system for moving an object to a target position, the system comprising:
    (a) a first actuator configured to exert a force on said object in a first direction in response to a control current, the actuator having an actuator gain and the generated force being a function of the control current and the actuator gain, the first actuator comprising:
        (i) a magnet configured to induce a magnetic field; and
        (ii) a coil arranged in said magnetic field, the magnet and the coil being movable relative to each other;
    (b) a power supply configured to supply the control current to the actuator in response to a control signal; and
    (c) a control system configured to control the force generated by the actuator by supplying the control signal to the power supply, the control signal being adapted to the actuator gain, said gain being a function of a system parameter.

2. The positioning system of claim 1, wherein the control system is configured to determine a time-variant force to be exerted on the object to move the object to the target position, and to output a time-variant control signal to the power supply to generate said force.

3. The positioning system of claim 1, wherein the system parameter is a distance between the coil and the magnet in a direction substantially perpendicular to said first direction, and wherein the control system is configured to adapt the control signal to the distance between the magnet and the coil.

4. The positioning system of claim 1, wherein the system parameter is the control current supplied to the actuator, and wherein the control system is configured to adapt the control signal to the control current.

5. The positioning system of claim 1, wherein the control system comprises a second actuator that is configured to exert a compensation force on a part of the first actuator so as to compensate a parasitic force exerted on said part of the first actuator.

6. The positioning system of claim 5, wherein the actuator gain is determined in a second direction substantially perpendicular to said first direction, and wherein the control system is configured to supply a control signal to the second actuator to compensate a force generated in said second direction.

7. The positioning system of claim 6, wherein the control signal is supplied to the second actuator via a feed-forward circuit.

8. A lithographic apparatus comprising:
    (1) an illumination system configured to condition a beam of radiation;

(2) a pattern support configured to support a patterning device, the patterning device serving to impart the beam of radiation with a pattern in its cross-section;

(3) a substrate support configured to hold a substrate;

(4) a projection system configured to project the patterned beam onto a target portion of the substrate, and (5) a positioning system configured to control a movement of one of said supports, the system including (a) a first actuator configured to exert a force on said one support in a first direction in response to a control current, the actuator having an actuator gain and the generated force being a function of the control current and the actuator gain, the actuator comprising:

(i) a magnet configured to induce a magnetic field; and (ii) a coil arranged in said magnetic field, the magnet and the coil being movable relative to each other;

(b) a power supply configured to supply the control current to the actuator in response to a control signal; and (c) a control system configured to control the force generated by the actuator by supplying the control signal to the power supply, the control signal being adapted to the actuator gain, said gain being a function of at least one parameter.

9. The lithographic apparatus of claim 8, further comprising another positioning system configured to control a movement of the other one of said supports, said positioning system comprising (a) an actuator configured to exert a force on the other one of said supports, the actuator having an actuator gain and the generated force being a function of the control current and the actuator gain, (b) a power supply configured to supply the control current to the other actuator in response to a control signal; and (c) a control system configured to control the force generated by the actuator by supplying the control signal to the power supply, the control signal being adapted to the actuator gain, said gain being a function of at least one parameter.

10. The apparatus of claim 8, wherein the control system is configured to determine a time-variant force to be exerted on said support to move said support to the target position, and to output a time-variant control signal to the power supply to generate said force.

11. The lithographic apparatus of claim 8, wherein the at least one parameter comprises a distance between the coil and the magnet in a direction substantially perpendicular to said first direction, and wherein the control system is configured to adapt the control signal to the distance between the magnet and the coil.

12. The lithographic apparatus of claim 8, wherein the at least one parameter comprises the control current supplied to the actuator, and wherein the control system is configured to adapt the control signal to the control current.

13. The lithographic apparatus of claim 8, wherein the control system comprises a second actuator that is configured to exert a compensation force on a part of the first actuator so as to compensate a parasitic force exerted on said part of the first actuator.

14. A positioning method for moving an object to a target position, the method comprising:

determining an actuator gain of an actuator as a function of a parameter, the actuator being adapted to exert a force on said object in a first direction in response to a control current supplied by a power supply, said force being a function of the control current and the actuator gain;

determining a value of the parameter as a function of which the actuator gain is predetermined;

controlling the force generated by the actuator by supplying a control signal to a power supply, the control signal being adapted to the predetermined actuator gain as a function of the parameter, and supplying the control current from the power supply to the actuator in response to the control signal.

15. A device manufacturing method comprising:

(a) projecting a patterned beam of radiation onto a target portion of a substrate, and (b) positioning an object to a target position, the positioning comprising:

(i) determining an actuator gain of an actuator as a function of a parameter, the actuator being adapted to exert a force on said object in a first direction in response to a control current supplied by a power supply, said force being a function of the control current and the actuator gain;

(ii) controlling the force generated by the actuator by supplying a control signal to a power supply, the control signal being adapted to the actuator gain, and (iii) supplying the control current from the power supply to the actuator in response to the control signal.

16. The method of claim 15, wherein said object is the substrate or a patterning device configured to pattern the beam of radiation.

* * * * *